United States Patent [19]

Yada

[11] Patent Number: 4,574,271
[45] Date of Patent: Mar. 4, 1986

[54] MULTI-SLOPE ANALOG-TO-DIGITAL CONVERTER

[75] Inventor: Eiichi Yada, Gyoda, Japan

[73] Assignee: Takeda Riken Co., Ltd., Tokyo, Japan

[21] Appl. No.: 440,411

[22] Filed: Nov. 9, 1982

[30] Foreign Application Priority Data

Nov. 9, 1981 [JP] Japan ............................ 56-179916

[51] Int. Cl.$^4$ .................... H03K 13/02; H03K 13/20
[52] U.S. Cl. ...................... 340/347 NT; 324/99 D; 340/347 AD; 340/347 CC; 340/347 M
[58] Field of Search ............. 340/347 NT, 347 AD, 340/347 CC, 347 M; 324/99 D, 78 D, 78 E

[56] References Cited

U.S. PATENT DOCUMENTS 3,577,140  5/1971  Aasnaes ..................... 340/347 NT
4,354,176 10/1982  Aihara ....................... 340/347 NT
4,357,600 11/1982  Ressmeyer et al. ......... 340/347 NT Primary Examiner—T. J. Sloyan
Attorney, Agent, or Firm—Staas & Halsey

[57] ABSTRACT

A multi-slope analog-to-digital converter avoids the dielectric absorption problem by providing a predetermined number of risings and fallings of the output of an integrator integrating an input analog signal during a first predetermined period of time, each falling corresponding to the simultaneous integration of a first reference signal during the first integration period. Subsequently the first reference signal is integrated for a time period to assure that the output signal of the integrator has a predetermined polarity, prior to completing the measurement of the input analog signal during further integration periods. Variations in the number of switching delays, and variations depending upon the direction with which the output of the integrator approaches a reference level, may thus be avoided.

28 Claims, 8 Drawing Figures

MULTI-SLOPE ANALOG-TO-DIGITAL CONVERTER

BACKGROUND OF THE INVENTION

This invention relates to a multi-slope integrating analog-to-digital converter which integrates input analog signals during a first integration period, during which a first reference signal of opposite polarity to the input signal is integrated repeatedly together with the input analog signal so as to cause a predetermined number of cycles of rising and falling at the integrator output, after which a second reference signal and a third reference signal are integrated during respective second and third integration periods, to obtain a digital signal corresponding to an input analog signal by measuring the time intervals of the first reference signal being integrated and the second and third integration periods.

A dual-slope type integrating analog-to-digital converter is well known in the art. In such an analog-to-digital converter, an input signal is provided to an integrator and is integrated during the first integration period $T_1$, resulting in a rising slope being output from the integrator as shown in FIG. 1. At the end of the first integration period $T_1$, a reference signal of opposite polarity to the input signal is provided to the integrator so as to cause a falling slope at the integrator output. As illustrated in FIG. 1, a second integration period $T_x$ begins at a time when the reference signal integration starts, and ends at the time when the integrated signal reaches a predetermined voltage level, for example, the voltage level at the beginning of the integration, which is typically provided to be ground potential.

When the input analog signal is small, the integrated output at the end of the first integration period $T_1$ is small because the first integration period is fixed, and thus the second integration period $T_x$ becomes short as shown by the broken line in FIG. 1. In other words, the second integration period $T_x$ depends on the voltage level of the input analog signal. The second integration period $T_x$ is measured for example by a counter, and accordingly the measured digital data corresponds to the value of the input analog signal.

A prior art triple-slope analog-to-digital converter is described in U.S. Pat. No. 3,577,140, in which an input signal to be measured is integrated for a fixed period, and then the integrated value is down-counted to a predetermined level while applying a reference signal, followed by completing the down-counting into a less significant digit while applying a smaller reference signal. U.S. Pat. No. 4,354,176 describes an analog-to-digital converter that for instance avoids inaccuracies due to reaching said predetermined level during the middle of a clock pulse.

In such known analog-to-digital converters, a voltage supplied across an integrating capacitor increases when the input analog voltage increases, resulting in the so-called dielectric absorption problem. The dielectric absorption problem concerns a degrading of the linearity of the voltage charged in the integrating capacitor when a high voltage is supplied to the integrator. Thus analog to digital conversion with high accuracy is difficult with this prior art.

For solving this problem, a multi-slope integrating analog-to-digital converter is known, for instance as described at page 9 of the Hewlett-Packard Journal of February 1977. FIG. 2A is a block diagram of such a prior art example of a multi-slope analog to digital converter, and FIG. 2B is a voltage-time diagram of the multi-slope analog-to-digital converter of FIG. 2A. According to this multi-slope analog-to-digital converter, within the first integration period $T_1$ a first reference signal, of opposite polarity to the input analog signal and of greater absolute value than the maximum input analog signal to be measured, is applied to the integrator 14 each time the integrator signal reaches a predetermined voltage $V_1$. The comparator 24T in FIG. 2A is used for sensing the integrated signal crossing the voltage level $V_1$.

Thus the output from the integrator 14 begins to fall as in FIG. 2B and, after the fixed time interval $T_3$, the first reference signal is stopped from supplying the integrator 14 in order to integrate the input signal alone. The integrated signal again begins to rise and, when it reaches the predetermined voltage $V_1$ again, the first reference signal is again integrated together with the input signal during the subsequent fixed period $T_3$.

This process is repeated during the first integration period $T_1$, and, after the first integration period $T_1$, the second reference signal $I_2$, of opposite polarity from the integrated signal at the end of the first integration period $T_1$, is provided to the integrator 14 so that the second integration $T_x$ begins. The second integration period $T_x$ ends when the integrated signal crosses the predetermined voltage level in the same way as the dual-slope analog-to-digital converter. For the $T_x$ and the $T_3$ periods, digital signals are obtained for providing a digital value corresponding to the input analog signal.

According to this prior art multi-slope integrating analog-to-digital converter, since the integrating capacitor is not supplied with a voltage higher than $V_1$, the linearity error originating from the dielectric absorption problem does not occur. However, when the input analog signal is small, the number of times the fixed integration period $T_3$ occurs within the first integration period is reduced, as shown by the broken line in FIG. 2B. Because the slope of the integrated output is lower, it takes a longer time to get to the voltage $V_1$, and conversely, when the input analog signal is increased, the number of times of the period $T_3$ occurs is also increased. Therefore, according to the voltage level of the input analog signal, there is a variation in the number of times the integration period $T_3$ occurs, that is, during which both the input signal and the first reference signal are integrated.

The first reference signal $I_1$ is provided to the integrator 14 through a switch 17 as illustrated in FIG. 2A, and the switch 17 has a delay time when it is closed or opened by a control signal, and thus an error caused by these delay times is included in the time period $T_3$. It is possible to compensate for this error if it is always the same. However, the error varies in accordance with the level of the input analog signal, since the number of times the switching operation occurs depends on the voltage level of the input signals. Accordingly, compensation for the error caused by this switching delay time is not feasible in this prior art multi-slope integrating analog-to-digital converter. This error is especially damaging in high speed analog-to-digital conversion.

SUMMARY OF THE INVENTION

It is an object of the present invention to provide a multi-slope, integrating, analog-to-digital converter which is capable of compensating for errors caused by the delay time of a switch by making constant the number of times the output of an integrator rises and falls within the first integration period.

It is another object of the present invention to provide a multi-slope analog-to-digital converter which is capable of converting an input analog signal to a corresponding digital signal with high speed.

It is a further object of the present invention to provide a multi-slope, integrating, analog-to-digital converter which is capable of improved resolution by employing a third integration.

It is another object of the present invention to provide a multi-slope analog-to-digital converter which is capable of high accuracy by sensing a threshold level of the integrated signal with the integrated signal approaching the threshold level from the same direction and with the same slope regardless of the polarity of the voltage of the input analog signal.

According to the present invention, the number of times an integration period occurs during which both the input signal and the reference signal are simultaneously integrated is fixed, that is, the number of times the output of the integrator rises and falls during the first integration period is always the same. More specifically, the switching operation, by which the reference signal is provided to the integrator while the input analog signal is being integrated, is performed a fixed number of times. Since the error caused by the switching time may therefore be made constant, it is possible to compensate for this error.

As mentioned before, the error caused by the switching time is especially harmful in high speed analog-to-digital conversion, and thus the cancellation of the error makes it possible for a multi-slope analog-to-digital converter to operate at high speed.

In this invention a third integration may also be employed for increasing resolution. During the third integration a reference signal of less magnitude than the other reference signal is integrated so as to generate a gentle slope at the integrator output so that the integration time is increased, thereby increasing resolution. Since the third integration is operated for a lower bit digital signal, it is possible to operate this multi-slope analog-to-digital converter without sacrificing conversion speed.

Further, in the present invention, an error caused by the comparator which detects the ending time of each integration period may be eliminated for increasing conversion accuracy. In an actual comparator circuit the detecting speed is different between the case in which the integrated signal to be detected is changing from a higher voltage than the reference level toward a lower voltage, as compared to changing from a lower voltage than the reference level toward a higher voltage. In this invention, after the first integration period, a reference signal is provided to the integrator to make the output from the integrator go to a specific predetermined polarity regardless of the polarity or magnitude of the input analog signal. Accordingly, the integrated signal after the first integration period may be used to approach the reference signal level from a predetermined direction, for all input signals at all times, and thus error caused by differences in sensing speed of the comparator may be eliminated and accuracy increased.

DETAILED DESCRIPTION OF THE PREFERRED EMBODIMENTS

Figure 1:
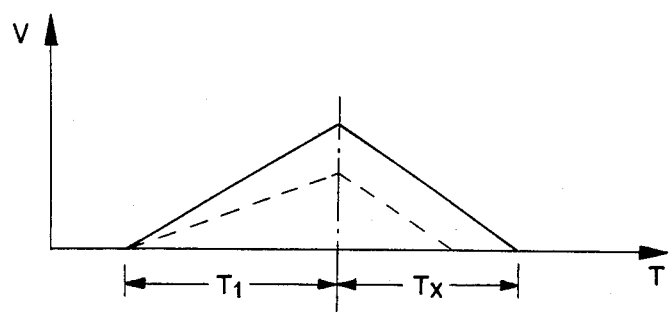
FIG. 1 is a voltage-time diagram of a dual-slope analog-to-digital converter.
Figure 2A:
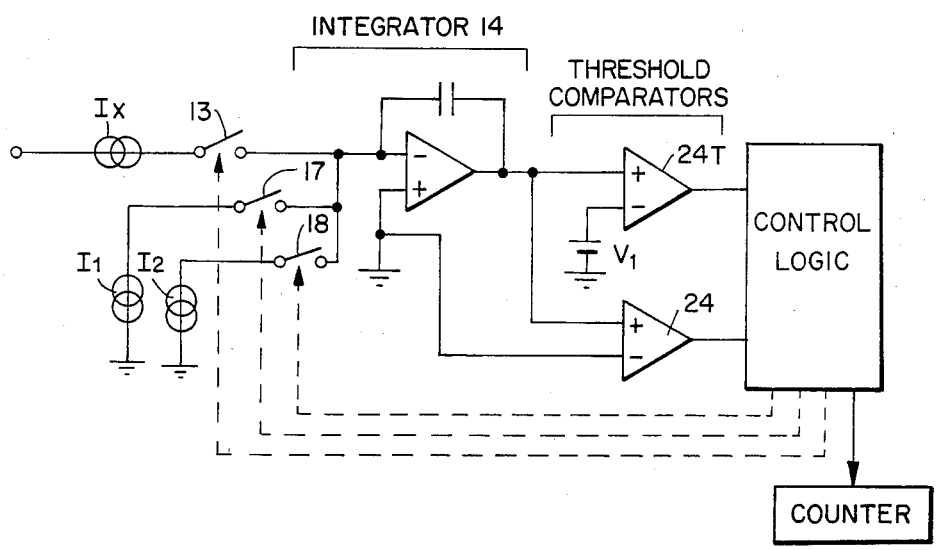
FIG. 2A is a block diagram of one example of a prior art multi-slope analog-to-digital converter.
Figure 2B:
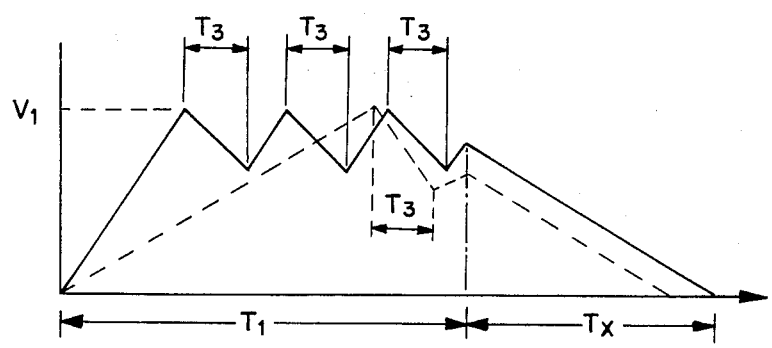
FIG. 2B is a voltage-time diagram of the prior art multi-slope analog-to-digital converter of FIG. 2A.
Figure 3:
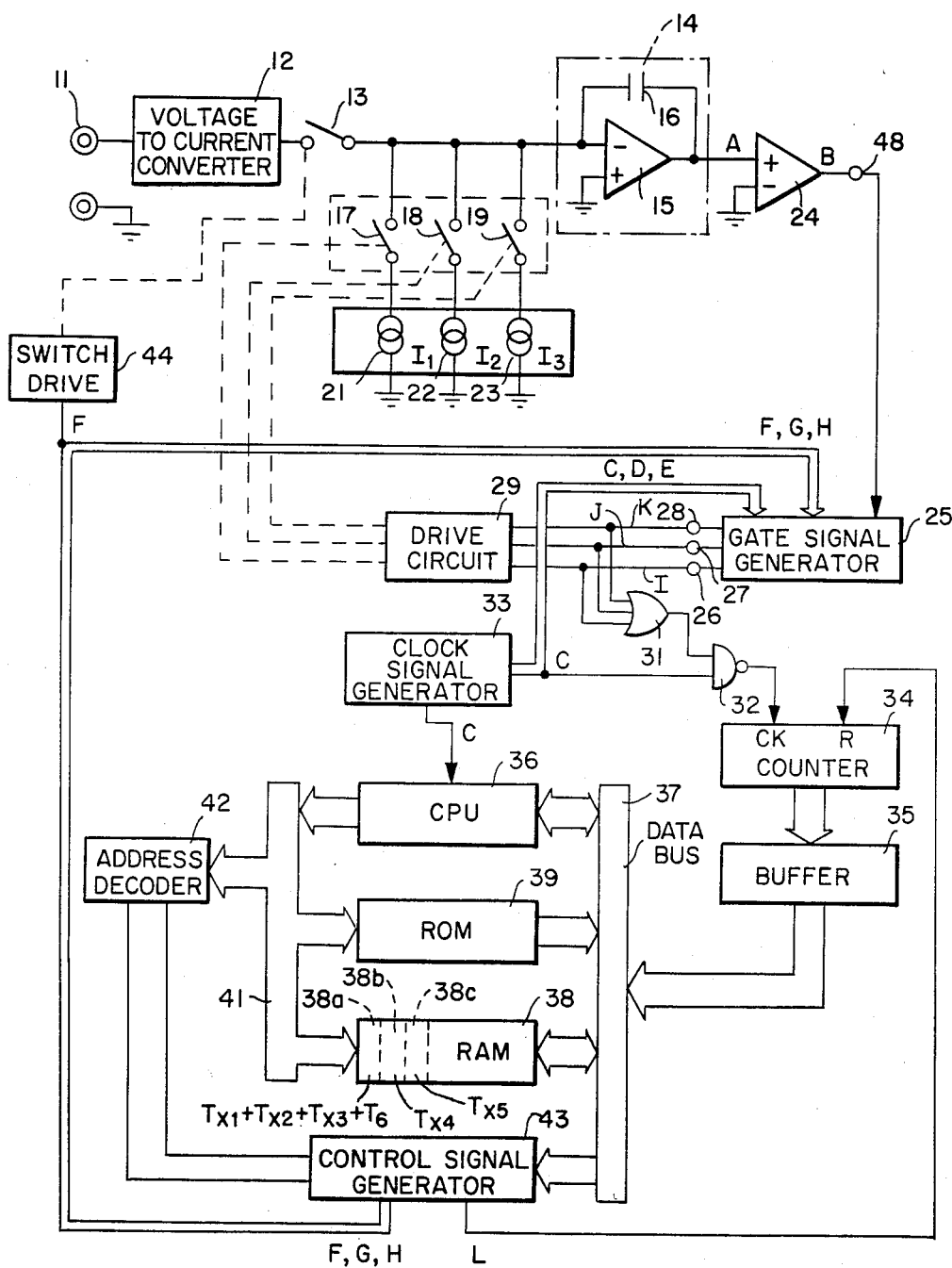
FIG. 3 is a block diagram of a multi-slope, integrating analog-to-digital converter in accordance with a preferred embodiment of the present invention.

FIG. 3 shows a preferred embodiment of the present invention. An input analog voltage $V_x$ at the input terminal 11 is converted to a corresponding analog current by a voltage-to-current converter 12. The converted analog current is provided to an integrator 14 through a switch 13 which is controlled by a signal from a switch drive circuit 44. The integrator 14 is comprised, for example, of an operational amplifier 15 and an integrating capacitor 16 which is connected between the output and the inverting input of the operational amplifier 15.

Each current source 21, 22, 23 generates a corresponding reference current $I_1$, $I_2$, $I_3$ and provides the reference current to the integrator 14. The output of the integration is compared with a predetermined reference level such as ground potential by the comparator 24. The output of the comparator 24 is connected to a gate signal generator 25 which generates gate signals at terminals 26, 27, 28. The gate signals from terminals 26, 27, 28 respectively control the switches 17, 18, 19 through a switch drive circuit 29.

The gate signals are also provided to the NAND gate 32 via an OR gate 31, to control the NAND gate 32 to selectively gate clock signals from a clock signal generator 33. The gated clock signals are provided from the NAND gate 32 to a counter 34 wherein the clock signals (inverted in this case) are counted for measuring integration times.

The counted data is provided to a data bus 37 via a buffer 35 and is stored in a random-access memory 38 under the control of a central processor unit CPU 36. The CPU 36 works according to a program stored in a read-only memory 39 and, as a result of the program, address data is provided to an address decoder 42 through an address bus 41. The CPU 36 controls the operation in this embodiment and calculates a digital signal from the data stored in the random access memory 38. The decoded data from the address decoder 42 is provided to a control signal generator 43, whereby control signals such as a reset signal, period signals, etc. are generated.

Figure 4:
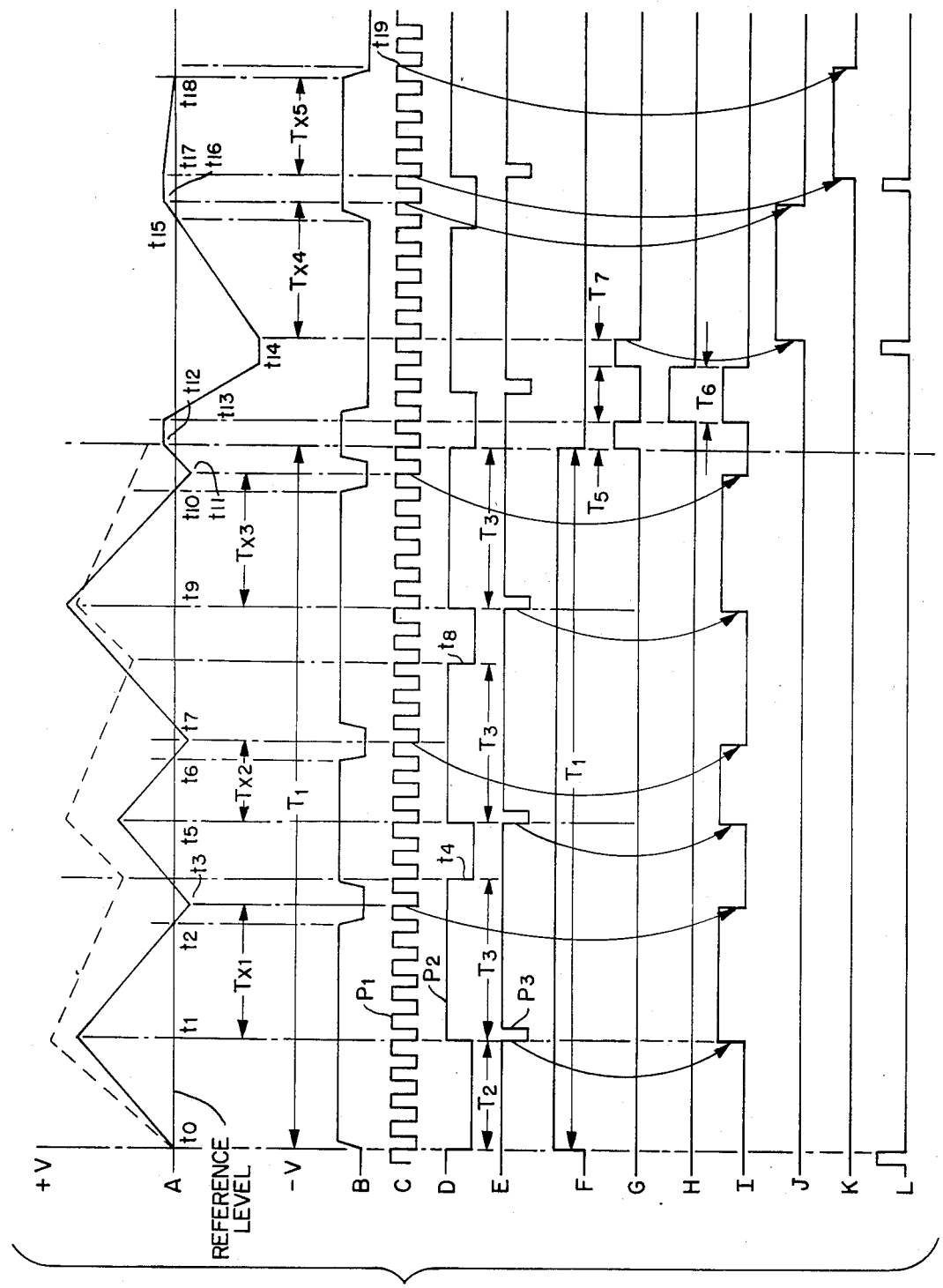
FIG. 4 shows waveforms A to L illustrating the operation of the multi-slope, integration, analog-to-digital converter of FIG. 3.

The waveforms A to L of FIG. 4 illustrate the operation of the embodiment shown in FIG. 3. In this embodiment several integration periods are employed. The first integration time period $T_1$ may be fixed, and the integrated value is shown by the solid line of waveform A. Various ones of the time periods, reference currents and reference levels may be adjusted in a predetermined manner depending on the magnitude and polarity of the input analog signals.

The clock signals $P_1$, $P_2$, $P_3$ generated by the clock signal generator 33 are illustrated by waveforms C, D and E respectively. The gate signals at terminal 26, 27, 28 of the gate signal generator 25 are shown by waveforms I, J and K respectively. Further, the control signals generated by the control signal generator 43 are illustrated by waveforms F, G and H respectively.

At the beginning of the analog-to-digital conversion, the switch 13 is closed so that the input analog voltage is applied to the integrator 14 after being converted to a corresponding current by the voltage-to-current converter 12. The input analog signal and the reference signals supplied to the integrator 14 may be in the form of current, not voltage, so as to suppress errors caused by internal resistance of the switches 13, 17, 18, 19.

The input analog signal thus provided is integrated by the integrator 14 all the time during the first integration period $T_1$. An output from the integrator 14 begins to rise linearly at time $t_0$ as shown by waveform A of FIG. 4.

At time $t_1$ the switch 17 is closed by the gate signal shown by waveform I, so as to provide the first reference current $I_1$ from the current source 21 to the integrator 14. The gate signal of waveform I is changed to high level by the falling edge of the clock signal $P_3$ of waveform E. While the gate signal of waveform I, that is, the gate signal from the terminal 26 of the gate signal generator 25, is at a high level, both the input analog signal and the first reference current $I_1$ are integrated. The first reference current $I_1$ is provided to be sufficiently large in magnitude as compared with the maximum input signal to be dealt with, in this embodiment, so that the integration signal begins to fall at time $t_1$.

When the integrated signal reaches the reference level within the time interval $T_3$ of the clock signal $P_2$ shown by waveform D of FIG. 4, the comparator 24 changes its state from high level to low level at time $t_2$, and by the first falling edge of the clock signal $P_1$ immediately after $t_2$, that is at time $t_3$, the gate signal of waveform I is changed to low level and thus the switch 17 is opened. If the integrated signal still remains above the reference level at the end of each interval $T_3$, as shown in the case of the dashed line of waveform A, the comparator keeps its high level until the clock signal $P_2$ of waveform D changes its state and the switch is opened by the falling edge of the clock signal $P_2$, that is, in synchronism with the end of the interval $T_3$.

In either case the output from the integrator 14 is increased after opening the switch 17 and attains a higher voltage than the reference level.

Further in this embodiment, at times $t_5$ and $t_9$ the switch 17 is closed again so that both the input signal and the first reference current $I_1$ are simultaneously integrated, and thus the integrated output signal starts to fall again each time. When the comparator 24 changes its state within the period $T_3$ of the clock signal $P_2$, for instance at time $t_6$ or $t_{10}$, the switch 17 is opened in synchronism with the falling edge of the clock signal $P_1$ immeditely following $t_6$ or $t_{10}$ by the gate signal of waveform I of FIG. 4. Again, if the comparator 24 remains in its high state at the end of the period $T_3$ as shown by the broken line of waveform A, the switch 17 is opened in synchronism with the end of the period $T_3$, that is at time $t_8$ or $t_{12}$. At time $t_{12}$ the period signal $T_1$ from the control signal generator 43 is changed to low state as shown by waveform F in FIG. 4, and the switch 13 is opened and thus the first integration period $T_1$ comes to an end.

Since the number of times that the rising and falling of the output of the integrator 14 occurs during the first integration period $T_1$ is determined by the clock signal $P_2$, and not by the level of the input analog signal, this number of times is always the same regardless of the input signal. Thus the error caused by the switching time of the switch 17 is fixed and can be eliminated.

The gate signal at the terminal 26 of the gate signal generator, shown by waveform I in FIG. 4, is also provided to the NAND gate 32 through the OR gate 31 to open the NAND gate 32 during its high level. Thus the clock signal $P_1$ from the clock signal generator 33 is provided to the counter 34, whereby the clock signals are counted. The counter 34 is initially reset by the reset signal from the control signal generator 34 at the beginning of the analog-to-digital conversion, as shown by waveform L of FIG. 4. During the occurrence of the high level of the gate signal from the terminal 26, the counter 34 counts the number of pulses of the clock pulse $P_1$ supplied during each of the periods $T_{x1}$ (which begins at $t_1$ and ends at $T_3$), $T_{x2}$ (which begins at $t_5$ and ends at $t_7$) and $T_{x3}$ (which begins at $t_9$ and ends at $t_{11}$).

The conversion operation after the first integration period $T_1$ is as follows. After the first integration period $T_1$, the period signals shown in FIG. 4 by waveforms G and H are supplied to the gate signal generator 25 from the control signal generator 43 control. During the period $T_5$ of the period signal shown in FIG. 4 by waveform G both the switch 13 and the switch 17 are opened so that no signal is applied to the generator. The reason for providing the period $T_5$ in this embodiment is to obtain enough time for opening the switch 17 as in the case of the integrated signal shown with the broken line of waveform A of FIG. 4, so that the number of times of the switching operation of the switch 17 is made equal for all input signals.

In synchronism with the end of the period $T_5$, the period $T_6$ starts as shown by waveform H, and, by the rising edge of the period signal $T_6$, the gate signal of waveform I is changed to high level. Accordingly, the switch 17 is closed again so as to supply the reference current $I_1$ from the current source 21 to the integrator 14 during the period $T_6$.

As mentioned before, the polarity of the slope of the integrated output signal during the second and third integration periods $T_{x4}$ and $T_{x5}$ may be fixed for eliminating the error caused by the detection speed of the comparator 24. Thus the period of time $T_6$ is suitably selected to allow the integrated output signal to assure a specific polarity, in this embodiment a negative voltage, at the beginning of the second integration period $T_{x4}$ regardless of the value of the input analog signal. Thus, during the period $T_6$ the output from the integrator 14 falls to a negative value as shown by the solid line of waveform A in FIG. 4, and during the period $T_6$ the clock signal $P_1$ is provided to the counter 34. The total count of time in the counter 34 then corresponds to the time period $T_{x1} + T_{x2} + T_{x3} + T_6$, and this data is stored in the random access memory 38 during the period $T_7$.

After the period $T_6$, the counter 34 is reset by the reset signal generated by the control signal generator 43. By the falling edge of the period signal $T_7$ the gate signal at terminal 27 of the gate signal generator 25 changes to high level as shown by waveforms J in FIG. 4, and thus the switch 18 is closed so as to provide the second reference current $I_2$ from the current source 22 to the integrator 14. As a result, the second integration $T_{x4}$ begins and, since the reference current $I_2$ is provided with opposite polarity than that of the reference current $I_1$, the output from the integrator 14 starts to rise at time $t_{14}$ as shown by the solid line of waveform A in FIG. 4.

The gate signal from the terminal 27 of the gate signal generator 25 is also supplied to the NAND gate 32 via the OR gate 31, so that the counter 34 counts the clock signals $P_1$ during the second integration period $T_{x4}$. When the integration signal crosses the reference level at time $t_{15}$ the comparator 24 is changed to high level, and by the falling edge of the clock signal $P_1$ immediately following $t_{15}$, that is at time $t_{16}$, the gate signal from the terminal 27 is changed to low level so that the switch 18 is opened and the NAND gate 32 is closed. The data counted by the counter 34, corresponding to the second integration period $T_{x4}$ (which begins at $t_{14}$ and ends at $t_{16}$), is stored in the random access memory 38 and after that the counter 34 is reset by the reset signal as shown by waveform L in FIG. 4.

In this embodiment the third integration may be employed so as to acquire higher resolution. In the third integration the third reference current $I_3$ which has less magnitude than the second reference current $I_2$ is supplied to the integrator 14 so as to make less steep the slope of the output of the integrator 14, and thus the number of clock pluses counted by the counter 34 during the time period $T_{x5}$ is increased. At time $t_{17}$, with the falling edge of the clock signal $P_1$, the gate signal generated at the terminal 28 of the gate signal generator 25 is changed to high level so as to close the switch 19 and to open the NAND gate 32. Therefore the third reference current $I_3$ is provided to the integrator 14 from the current source 23 and the third integration period $T_{x5}$ begins as shown by the solid line of waveform A of FIG. 4.

When the integrated signal reaches the reference level at time $t_{18}$, the comparator 24 changes its state from high level to low level. By the falling slope at $t_{19}$ of the clock signal $P_1$ immediately after $t_{18}$, the gate signal at terminal 28 is changed to low level as in waveform K of FIG. 4. During the third integration period $T_{x5}$ (which begins at $t_{17}$ and ends at $t_{18}$) the clock signals $P_1$ are counted by the counter 34 and the counted data is stored in the random access memory 38.

For obtaining the relationship between the input analog signal and the stored data in the random access memory 38, a description is now made in terms of the charges stored in the capacitor 16 of the integrator 14, wherein:

$Q_1$ is a charge caused by the input analog signal during the first integration period $T_1$;

$Q_{x1}$, $Q_{x2}$, $Q_{x3}$ are the opposite polarity charges, that is, the discharges caused by the first reference current $I_1$ during the periods $T_{x1}$, $T_{x2}$, $T_{x3}$ respectively;

$Q_6$ is the discharge caused by the first reference current $I_1$ during the period $T_6$;

$Q_5$ is also a discharge value brought about by the third reference current $I_3$ during the third integration period $T_{x5}$; and $Q_{x4}$ is the charge caused by the second reference current $I_2$ during the second integration period $T_{x4}$.

At the end of the third integration period $T_{x5}$, since the output voltage from the integrator 14 is zero, the charge stored in the integrating capacitor 16 is also zero. Thus the following relation exists among the charges and discharges indicated above.

$$Q_1 + Q_{x4} = Q_{x1} + Q_{x2} + Q_{x3} + Q_6 + Q_{x5} \quad (1)$$

In one embodiment of the present invention the reference currents may be selected as follows. The magnitude of a reference current $I_r$ may be supplied as $I_1 = I_r$, the reference current $I_2$ may be set to $I_r/10$ and the reference current $I_3$ may be set to $I_r/1000$. Since the charge Q is the product of current I and time T, that is $Q = IT$, equation (1) may then be used to derive a value for the input analog signal, wherein $I_i$ is the corresponding input current:

$$I_i T_1 + (I_r/10)T_{x4} = I_r T_{x1} + I_r T_{x2} + I_r T_{x3} + I_r T_6 + (I_r/1000)T_{x5} \quad (2)$$

$$I_i = (I_r/T_1)(T_{x1} + T_{x2} + T_{x3} + T_6 - T_{x4}/10 + T_{x5}/1000)$$

Since the magnitudes of the reference current $I_r$ and the first integration period $T_1$ are known, and since the periods of time $T_{x1}$, $T_{x2}$, $T_{x3}$, $T_6$, $T_{x4}$, $T_{x5}$ are measured by the counter 34 and stored in the random access memory 38, the analog-to-digital conversion is accomplished according to the equation (2) as calculated by the CPU 36.

Figure 5:
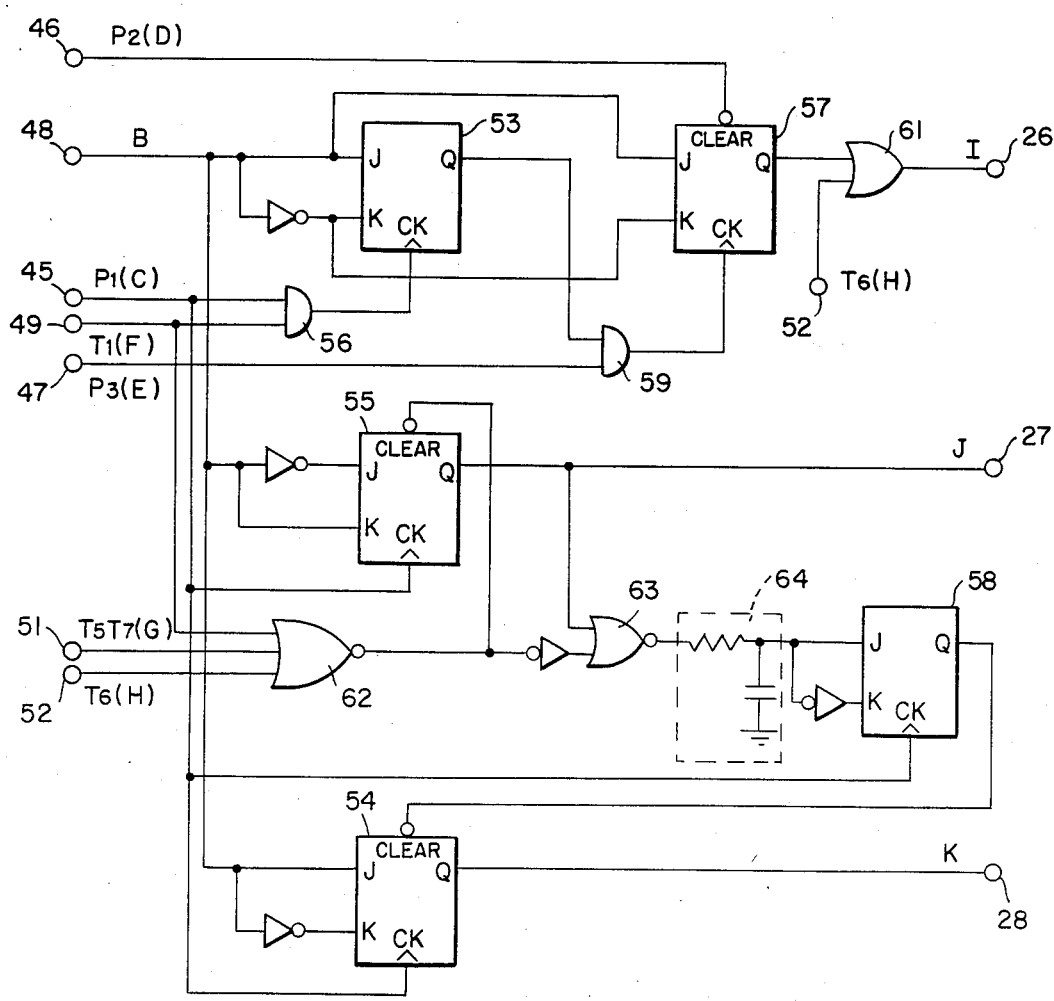
FIG. 5 is a suitable gate signal generator circuit used in the embodiment of FIG. 3.

The gate signal generator 25 may be constituted as illustrated in FIG. 5. The clock signals $P_1$, $P_2$, $P_3$ shown by waveforms C, D, E in FIG. 4 are supplied at terminals 45, 46, 47, waveform B in FIG. 4 is provided to the terminal 48. Also, the period signals $T_1$, $T_5$, $T_7$, $T_6$ generated by the control signal generator 43 as indicated by waveforms F, G, H are supplied at terminals 49, 51, 52. The output signal from the comparator 24 at terminal 48 is provided to the J inputs of the JK flip-flops 53, 54, 57 and to the K input of the JK flip-flop 55, and thru the respective illustrated inverters to the K inputs of the JK flip-flops 53, 54, 57 and to the J input of the JK flip-flop 55.

The clock signal $P_1$ at terminal 45 is provided to an AND gate 56 and also to clock terminals CK of the JK flip-flops 54, 55, 58. The period signal $T_1$ is supplied from the terminal 49 to the other input of the AND gate 56, and the output signal from the AND gate 56 is given to the clock terminal CK of the JK flip-flop 53. The Q output of the flip-flop 53 is input to the AND gate 59 whose other input is provided with the clock signal $P_3$ from the terminal 47. The output of the AND gate 59 is connected to the clock terminal of the flip-flop 57 whose clear terminal is supplied with the clock signal $P_2$ from the terminal 46.

At time $t_0$, since both the output from the comparator 24 and the period signal $T_1$ are changed to high level, the AND gate 56 is opened so as to provide the clock signals $P_1$ to the flip-flop 53, and thus the output Q of the flip-flop 53 goes to high level. The flip-flop 57 is at low level because of the low level of the clock signal $P_2$ supplied at the clear terminal.

At time $t_1$ the clock signal $P_2$ goes to high level and the clock signal $P_3$ is applied to the flip-flop 57 through the AND gate 59, and, by the falling edge of the clock pulse $P_3$, the flip-flop 57 is changed to high level since both the J and K terminals are at high level. When the output from the comparator 24 is changed to low level at time $t_2$, the Q output of the flip-flop 53 is changed to low level by the falling edge of the clock signal $P_1$ at time $t_3$, as illustrated by waveforms A, B and C in FIG.

4. Thus the output of the AND gate 59 becomes low level and the flip-flop 57 goes to low level because of the low level of the signal from the comparator 24. The Q output from the flip-flop 57 is provided at terminal 26 through an OR gate 61 whose other input is supplied with the period signal $T_6$ from the terminal 52.

As has been described above, the gate signal of waveform I in FIG. 4 is obtained at the terminal 26. The period signals $T_1$, $T_5$, $T_6$ and $T_7$ are provided to a NOR gate 62 whose output is connected to the clear terminal of the flip-flop 55 so that during each period $T_1$, $T_5$, $T_6$, $T_7$, that is during the time interval $t_0$ to $t_{14}$, the output Q of the flip-flop 55 is at low level. At the end of the period $T_7$, the signal at the clear terminal goes to high level and, by the falling edge of the clock signal $P_1$, the flip-flop 55 goes to high level because the inverted signal of the output from the comparator 24 is supplied at the input. When the signal from the comparator 24 rises as illustrated by waveform B in FIG. 4 at time $t_{15}$, the flip-flop 55 is changed to low level by the falling edge of the first clock signal $P_1$ immediately after $t_{15}$. Thus the gate signal of waveform J in FIG. 4 is generated at the terminal 27.

The output signal from the flip-flop 55 is also applied to a NOR gate 63 whose other input is the inverted output of the NOR gate 62. Accordingly, after the end of all the periods $T_1$, $T_5$, $T_6$, $T_7$, and $T_{x4}$ the J input of the flip-flop 58 is provided with high level signal from the NOR gate 63 through a delay circuit 64. Since the Q output signal from the flip-flop 58 is at low level and is provided to the clear terminal of the flip-flop 54, the output of the flip-flop 54 is at low level. At time $t_{16}$ the falling edge of the gate signal of waveform J of FIG. 4 is provided to the flip-flop 58 with a slight delay caused by the delay circuit 64, and thus the output of the flip-flop 58 is changed to high level by the clock signal $P_1$ with delay from the time $t_{16}$.

Thus the Q output of the flip-flop 54 is changed to high level at time $t_{17}$, since a high level signal from the comparator 24 is provided at both J and K inputs. When the comparator 24 is turned to low level at time $t_{18}$, the flip-flop 54 is changed to low level by the falling edge of the first clock signal $P_1$ immediately after $t_{18}$. Accordingly, the gate signal shown by waveform K in FIG. 4 is generated at the terminal 28.

Figure 6:
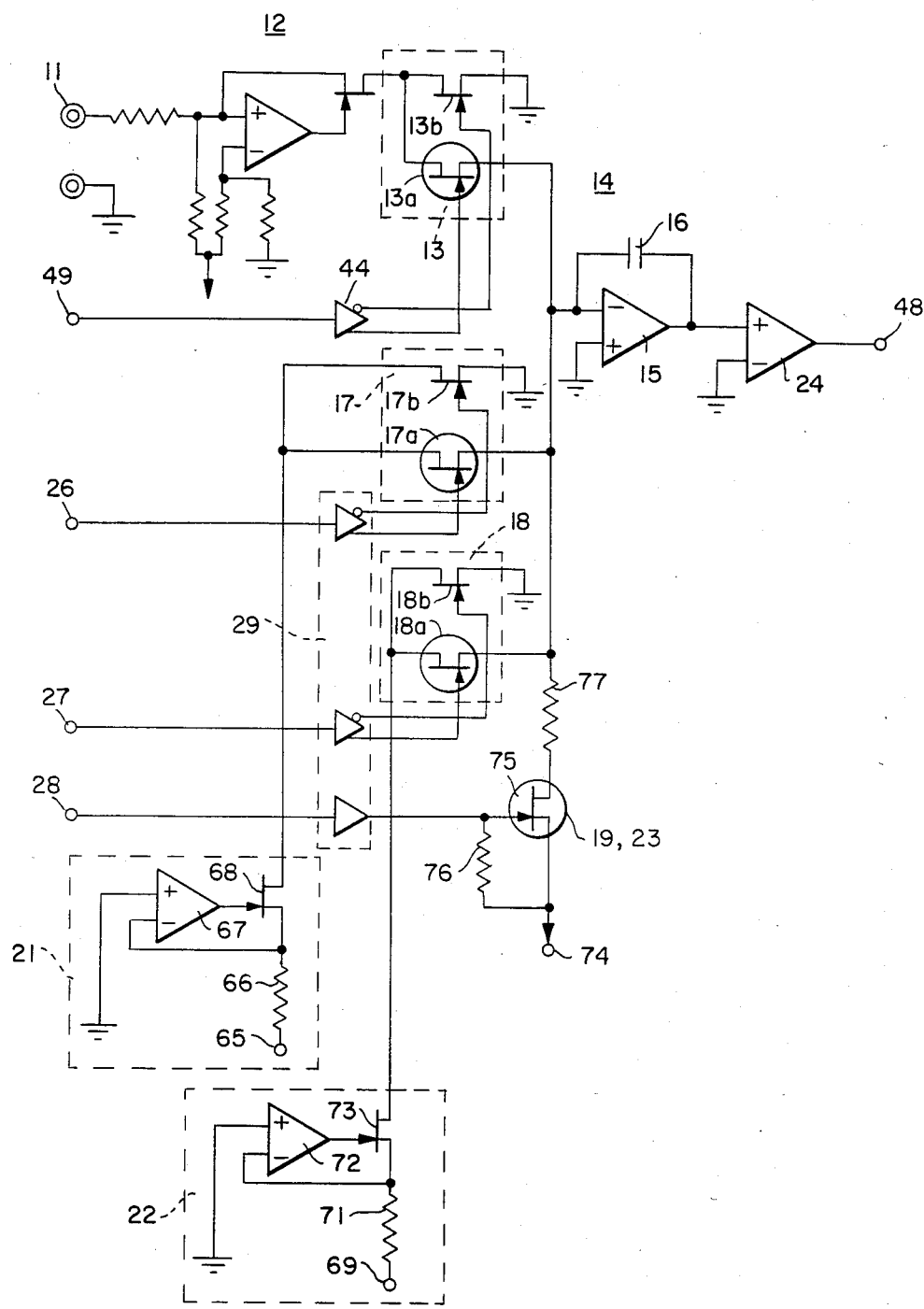
FIG. 6 shows suitable reference current source circuits and switching circuits which may be used in the embodiment of FIG. 3.

FIG. 6 is a circuit diagram showing an example of the current sources 21, 22, 23 and of the voltage-to-current converter 12. In this embodiment an input analog voltage of either positive or negative polarity is converted to a corresponding current of a single polarity. For example, an input analog voltage in the range from $+15$ to $-15$ V may be converted to a current in the range from 0 to $-6$ mA, so as to simplify the circuit of the analog-to-digital converter. Although a voltage-to-current converter which generates currents of both polarities can be used in the present invention, the circuit would become complicated because of the necessity of additional reference currents and also of a polarity detection circuit.

In FIG. 6, the switch 13 includes two FETs $13_a$, $13_b$ which are controlled together by the signals from the switch drive circuit 44. The FET $13_b$ is OFF and $13_a$ is ON during the first integration period $T_1$, so that the output of the voltage to the current converter 12 is connected to the integrator 14. Before the period $T_1$, the FET $13_b$ is turned ON so that the output current from the converter 12 is provided to ground.

The current source 21 includes the operational amplifier 67, a FET 68 and a resistor 66, as illustrated in FIG. 6. The reference current $I_1$ is acquired by converting a positive reference voltage of $+9$ V, for example, supplied at terminal 65, to a corresponding current.

The switch 17 includes a FET $17_a$ and a FET $17_b$, and is controlled by the gate signal from the terminal 26 of the gate signal generator 24 in the same way as the switch 13. That is, while the gate signal at the terminal 26 is at high level, the FET $17_a$ is closed and FET $17_b$ is open so as to provide the reference current $I_1$ to the integrator 14, and otherwise the FET $17_b$ is closed and FET $17_a$ is opened so as to short the reference current $I_1$ to ground.

The current source 22 includes an operational amplifier 72, a FET 73 and a resistor 71. A negative reference voltage $-9$ V, for example, supplied at terminal 69, is converted to the reference current $I_2$. The resistor 71 is ten times larger than the resistor 66 to provide the reference current $I_2$ with one tenth the value of the reference current $I_1$.

The switch 18 includes a FET $18_a$ and a FET $18_b$, and it works in the same way as the switches 13 and 17.

The switch 19 and the current source 23 include common components in this embodiment. A reference voltage, for example $+9$ V, applied at terminal 74, is converted to the reference current $I_3$ by the FET 75 and resistors 76, 77. The FET 75 is controlled to close or open by the gate signal provided from the terminal 28 of the gate signal generator 25. If the reference current $I_3$ is to be 1/1000th of the reference current $I_1$, the resistor 77 is selected to be 1000 times larger than resistor 66.

Figure 7:
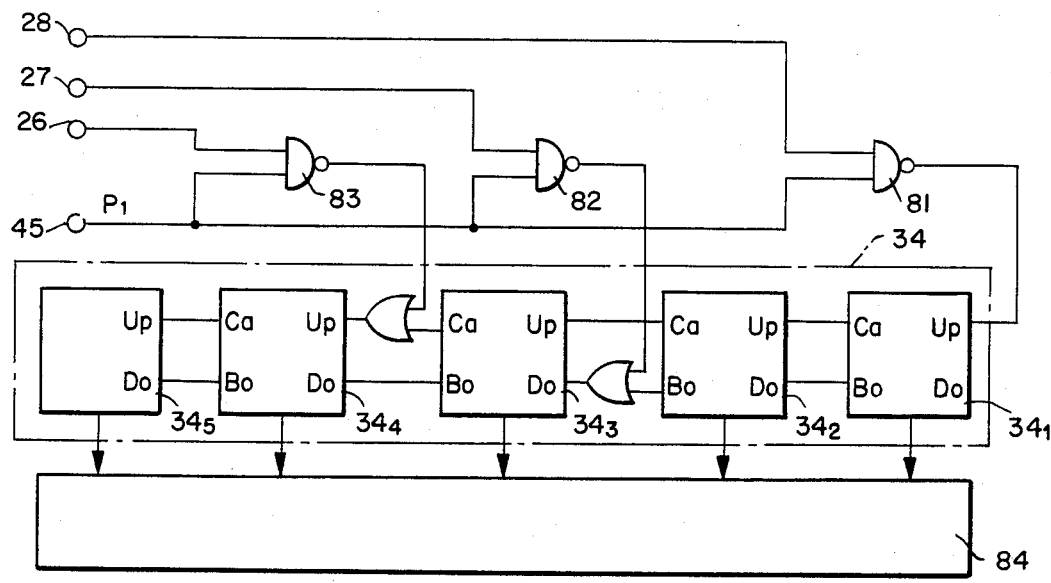
FIG. 7 is an example of a counter circuit suitable to be employed in the present invention.

When decade up-down counters as illustrated in FIG. 7 are used as the counter 34 of the preferred embodiment of FIG. 3, the random access memory 38 and the calculation of equation (2) by the CPU can be omitted. In FIG. 7 the counter 34 is a five digit counter comprised of the five decade up-down counters $34_1$ to $34_5$. The gate signals generated at the terminals 26, 27, 28 of the gate signal generator 25, shown by waveforms I, J, K in FIG. 4, are provided to the NAND GATES 83, 82, 81 respectively. The clock signal $P_1$ is also supplied to each NAND gate 83, 82, 81 so that the clock signal $P_1$ is gated by the gate signals supplied from the terminals 26, 27, 28. The gated clock signal from the NAND gate 81 is supplied to the up-count terminal of the counter of the least significant digit $34_1$. The gated clock signal $P_1$ from the NAND gate 82 is provided to the down-count terminal of the counter $34_3$. The clock signal $P_1$ from the NAND gate 83 is provided to the up-count terminal of the counter $34_4$. At the end of the third integration period $T_{x5}$, the counted data in the counter 34 is latched by register 84.

Many variations and extensions of the present invention would be obvious to a skilled worker in the art in light of the present disclosure.

I claim:

1. A converter for converting an input analog signal to a corresponding digital value, comprising
   a clock for providing clock pulses,
   an integrator for integrating signals input thereto and for providing an output corresponding to the integrated value,
   a first switch for inputting said input analog signal to said integrator during a first time period of predetermined length corresponding to a respective number of said clock pulses, a first reference signal and a second switch for inputting said first reference signal to said integrator together with said inputting of said analog input signal, said first reference signal having polarity opposite that of said input analog signal and a magnitude that is preselected to be larger than said input analog signal, a comparator for comparing said output of said integrator with a first reference level, and for providing a corresponding output indicating whether said output of the integrator is larger or smaller than said first reference level, means for driving said second switch to provide said inputting of said first reference signal to said integrator for a predetermined number of second time periods during said first time period, wherein the length of each said second time period has a predetermined maximum value and a shorter value depending on the occurrence of a change in the output of said comparator and the occurrences of said clock pulses, counting means for counting said clock pulses during said second time periods, calculating means for computing the digital value corresponding to the input analog signal based on information including the count values of said counting means during said second time periods, wherein the occurrence of each said shorter value of each said second time period effectively increases the range of the magnitude of the input analog signal that can be converted to said corresponding digital value, and the completion of the computing of the input value corresponding to the digital analog signal involves returning the integrated value output of said integrator to a further reference level.

2. The converter of claim 1, each said second time period beginning on the occurrence of a predetermined condition during said first time period.

3. The converter of claim 2, comprising
means for driving said second switch to input said first reference signal, of polarity equal to said first reference signal, after said first period of time, to said integrator for a third period of time that is sufficiently long to ensure that the output of said integrator has a respective predetermined polarity, said counting means counting said clock pulses during said third time period, said calculating means taking into account the counting of said clock pulses during said third time period for said computing of the digital value corresponding to the input analog signal, wherein the completion of said computing of the digital value corresponding to the input analog signal involves returning the output of said integrator to said further reference level from a predetermined direction.

4. The converter of claim 3, comprising
means for inputting a second reference signal, of polarity opposite to that of said first reference signal, after the end of said third time period, to said integrator during a fourth time period until the occurrence of a predetermined one of said clock pulses after said predetermined polarity of the integrator output is changed, said counting means counting said clock pulses during the inputting of said second reference signal, and said calculating means taking into account the count value of said clock pulses during the inputting of said second reference signal in computing said digital value corresponding to the input analog signal.

5. The converter of claim 4, comprising
means for inputting a third reference signal of opposite polarity than said second reference signal, after said inputting of said second reference signal during said fourth time period, to said integrator for a fifth time period until the output of said integrator equals said further reference level, said counting means counting said clock pulses during said fifth time period, and said calculating means taking into account the count value of said clock pulses during said fifth time period in computing the digital value corresponding to the input analog signal.

6. The converter of claim 5, said counting of clock pulses during the inputting of said second reference signal to said integrator during said fourth time period being effectively to a lower order digit of the count value than that of said counting of clock pulses during said second and third time periods.

7. The converter of claim 5, said counting of clock pulses during said fifth time period being effectively to a lower order digit of the count value than the counting of clock pulses during the inputting of said second reference signal to said integrator in said fourth time period.

8. The converter of claim 3, said further reference level and said first reference level being ground level.

9. A converter for converting analog input signals of a first polarity to corresponding digital value, comprising
a source of clock pulses, and first, second and third reference signals, said first and second reference signals having polarity opposite said first polarity, the magnitude of said first reference signal being larger than that of each said analog input signal, and said third reference signal having said first polarity, means for integrating each respective one of said input analog signals during a predetermined first period of time, while simultaneously integrating said first reference signal for a predetermined number of second time periods during said first time period, for providing an integrated output corresponding to the combined integration, means for adjusting the length of each said second time period based on a comparison of said integrated output and a first reference level, and on the occurrence of a predetermined one of said clock pulses after a predetermined change occurs in the result of said comparison, wherein each said second time period has a predetermined maximum value or a corresponding shorter value, means for integrating said second reference signal for a third time period selected to be sufficiently long so that the combined integrated value output from the integration during the first, second and third time periods has a predetermined polarity, means for integrating said third reference signal during a fourth time period until said integrated output crosses said known reference level, wherein the approach of said integrated output to said known reference level before the crossing of said known reference level occurs from a known direction with respect to the known reference level for each respective one of said analog input signals, means for counting the clock values occurring during said second, third and fourth time periods, for providing a digital value corresponding to the value of the respective analog input signal.

10. The converter of claim 9, said known reference level being ground potential.

11. The converter of claim 9, comprising means for integrating a fourth reference signal of opposite polarity to, and of smaller magnitude than, said third reference signal, while counting effectively into a lower order digit the clock pulses occurring during said integration of said fourth reference signal, until said integrated output returns to said known reference level.

12. The converter of claim 11, said known reference level being ground.

13. The converter of claim 9, the return of said integrated output to the known reference level being with the same slope for each said input analog signal.

14. A device for aiding in the digital measurement of input analog signals of a first polarity and having an absolute magnitude less than a first reference value, comprising integration means for integrating each respective one of said input analog signals for a first predetermined period, and for outputting a corresponding integrated value, offset and shortening means for offsetting said integration of each respective input analog signal by supplying a first reference signal, of said first reference value and of polarity opposite that of the respective input analog signal, to said integration means a predetermined number times during said first period together with the respective input analog signal, each of said predetermined number of times being for a second period of time that has a predetermined maximum value if said integrated value output from said integration means fails to change polarity during the respective second period, and for causing each said second period of time to be less than said predetermined maximum value when said integrated value output from said integration means changes polarity during the respective second period of time, wherein inconsistent variation, due to variation in the magnitude of said input alanog signals is prevented in the operation of said integration means and offset and shortening means for providing said integration of each respective input signal and said first reference signal, as a result of said predetermined number of second time periods.

15. The device of claim 14, said offset and shortening means including means for supplying a second reference signal, of the same polarity as said first reference signal, to said integration means after said first period of time for a third period of time which assures that said integrated value has a value that has a first predetermined relation with respect to a second reference value, wherein the measurement of the magnitude of the respective input analog signal can subsequently occur without inconsistencies due to the first predetermined relation not being achieved depending on the value of the respective input analog signal.

16. The device of claim 15, wherein said first predetermined relation is that said integrated value, at the end of said third time period, is a predetermined one of larger and smaller than said second reference value.

17. The device of claim 16, said offset and shortening means supplying a third reference signal to said integration means for integration during a fourth time period following said third time period, said fourth time period terminating after said integrated value from the integration of all said signals for the respective time periods achieves a second predetermined relation with respect to said second reference value.

18. The device of claim 17, said second predetermined relation corresponding to said integrated value crossing said second reference value.

19. The device of claim 18, said second reference value being ground potential.

20. The device of claim 18 comprising
a clock signal source and,
means for counting the integral number of clock signals occurring during each said second time period, for said measurement of the magnitude of the respective input analog signal,
wherein each of said first and second time periods is an integral number of the period of said clock signal.

21. The device of claim 15, comprising
a clock signal source,
means for counting the total number of clock signals occurring during each of said second and third periods of time for said measuring of the magnitude of the respective input analog signal, and
wherein each of said first, second and third time periods is a respective integral number of periods of said clock signal.

22. The device of claim 18, comprising
a clock signal source, and
means for counting the total number of integral clock signals occurring during each said second, third and fourth time periods, said fourth time period ending on a predetermined one of said clock signals after said crossing, wherein said value of the respective input analog signals can be calculated on the basis of the difference between the total number of counts from said second and third periods of time and the count for said fourth period of time.

23. The device of claim 20, said offset and shortening means and said integration means and said counting means comprising means for integrating a fourth reference voltage for a fifth period of time, while counting the integral number of said clock signals that occur during said fifth period of time, so that said value of respective input analog signal can be subsequently determined on the basis of the total count of said clock signals during said second, third and fifth time periods, less the count during said fourth time period, wherein said fifth time period is selected to terminate when said integrated value achieves a third predetermined relation with respect to said second reference value, and the effective rate of occurrence of said clock signals during said fifth integration period is increased with respect to unit change in said integrated value, in comparison to the effective rate during said fourth integration period.

24. The device of claim 14, said second reference signal being said first reference signal.

25. The device of claim 23, said third predetermined relation being said integrated value being equal to said second reference level.

26. The device claim 25, said second reference value being ground potential.

27. The device of claim 14, said offsetting and shortening means including a switch for connecting said second reference signal to said integration means for said integration thereof, wherein said switch is operated the same number of times during said first period, independently of the length of each said second period.

28. The device of claim 14, for aiding in the digital measurement of exterior signals selected to have absolute values less than said first reference signal, said device comprising conversion means for converting each of said selected exterior signals to said first polarity to provide said input analog signal.

* * * * *

UNITED STATES PATENT AND TRADEMARK OFFICE
CERTIFICATE OF CORRECTION

PATENT NO. : 4,574,271
DATED : March 4, 1986
INVENTOR(S) : EIICHI YADA

It is certified that error appears in the above-identified patent and that said Letters Patent is hereby corrected as shown below:

Column 6, line 23, "$T_3$)" should be --$t_3$)--;
    line 30, "period" (second occurrence) should be --control--;
    line 31, "G" should be --G,--;
    line 66, "waveforms" should be --waveform--.
Column 11, line 33, "input" should be --digital--; digital" should be --input--;
    line 42, "signal, of polarity equal to said first" should be --signal--;
    line 43, delete "reference signal,".
Column 13, line 31, delete "of said first refer-";
    line 32, delete "ence value and"; and delete "the";
    line 33, "respective input analog signal," should be --said first polarity--;
    line 34, after "means" insert --for--; after "number" insert --of--;
    line 37, after "a" (1st occurrence) insert --respective--;
    line 47, "alanog signals" should be --analog signals,--.

Signed and Sealed this

Fifteenth Day of July 1986

[SEAL]

Attest:

DONALD J. QUIGG

Attesting Officer      Commissioner of Patents and Trademarks